US010871409B2

(12) United States Patent
Sipila et al.

(10) Patent No.: US 10,871,409 B2
(45) Date of Patent: Dec. 22, 2020

(54) SMD-COIL-BASED TORQUE-SENSOR FOR TANGENTIAL FIELD MEASUREMENT

(71) Applicant: GE AVIO S.R.L., Rivalta di Torino (IT)

(72) Inventors: Pekka Tapani Sipila, Bavaria (DE); Christoph Boeld, Bavaria (DE)

(73) Assignee: G.E. Avio S.r.l., Rivalta di Torino (IT)

( * ) Notice: Subject to any disclaimer, the term of this patent is extended or adjusted under 35 U.S.C. 154(b) by 0 days.

(21) Appl. No.: 16/196,972

(22) Filed: Nov. 20, 2018

(65) Prior Publication Data

US 2019/0187011 A1 Jun. 20, 2019

(30) Foreign Application Priority Data

Dec. 15, 2017 (IT) .................. 102017000145097

(51) Int. Cl.
*G01L 3/00* (2006.01)
*G01L 3/10* (2006.01)
*G01L 1/12* (2006.01)
*G01R 33/09* (2006.01)
*H01L 41/12* (2006.01)

(52) U.S. Cl.
CPC .............. *G01L 3/102* (2013.01); *G01L 1/125* (2013.01); *G01R 33/09* (2013.01); *H01L 41/125* (2013.01)

(58) Field of Classification Search
CPC ......... G01L 3/102; G01L 1/125; G01R 33/09; H01L 41/125
USPC ...................................... 73/862.333
See application file for complete search history.

(56) References Cited

U.S. PATENT DOCUMENTS

| 4,539,835 A | * | 9/1985 | Shambroom | .......... | G01B 7/082 324/662 |
| 4,727,321 A | * | 2/1988 | Huschelrath | ........... | G01N 27/82 324/226 |
| 5,317,908 A | * | 6/1994 | Fitzgerald | ............ | G01N 11/162 73/54.25 |
| 5,708,216 A | | 1/1998 | Garshelis | | |

(Continued)

FOREIGN PATENT DOCUMENTS

| EP | 0523025 A1 | 1/1993 |
| WO | 2015043915 A1 | 4/2015 |
| WO | 2015150090 A1 | 10/2015 |

OTHER PUBLICATIONS

Ruser et al., "Low-cost magnetic torque sensor principle", Proceedings of IEEE Sensors, vol. 02, pp. 901-904, Jun. 12-14, 2002.

(Continued)

*Primary Examiner* — Max H Noori
(74) *Attorney, Agent, or Firm* — Dority & Manning, P.A.

(57) ABSTRACT

According to some embodiments, system and methods are provided, comprising an installed product including a drive shaft; a magnetostrictive sensor having a sensor probe comprising: a substrate; a drive coil operative to receive a drive current and to emit a magnetic field through the drive shaft, wherein the drive coil is mounted on the substrate; one or more sense coils operative to receive the magnetic field and to transmit a signal based on the received magnetic field, wherein the one or more sense coils are mounted on the substrate; and wherein the magnetic field is emitted from the drive coil in a transverse direction to a radius of the drive shaft. Numerous other aspects are provided.

20 Claims, 7 Drawing Sheets

(56) References Cited

U.S. PATENT DOCUMENTS

| | | |
|---|---|---|
| 6,237,428 B1 | 5/2001 | Odachi et al. |
| 6,330,833 B1 * | 12/2001 | Opie ..................... G01L 3/102 |
| | | 73/862.333 |
| 8,020,455 B2 | 9/2011 | Sihler et al. |
| 8,170,811 B2 | 5/2012 | Grab et al. |
| 9,146,163 B2 | 9/2015 | Sipila et al. |
| 9,212,958 B2 | 12/2015 | Campbell et al. |
| 9,234,811 B2 | 1/2016 | Brummel et al. |
| 9,476,691 B2 | 10/2016 | May |
| 9,506,824 B2 | 11/2016 | Motoe et al. |
| 2007/0089538 A1 | 4/2007 | Kashimura et al. |
| 2010/0015918 A1 * | 1/2010 | Liu ........................ H04B 5/00 |
| | | 455/41.1 |
| 2015/0008912 A1 | 1/2015 | Maier et al. |
| 2016/0178464 A1 | 6/2016 | Burns et al. |
| 2016/0195438 A1 | 7/2016 | Brummel et al. |
| 2016/0230591 A1 | 8/2016 | Brummel et al. |

OTHER PUBLICATIONS

Sasada et al., "A figure-of-eight flexible coil for a magnetostrictive torque sensor", 2006 IEEE International Magnetics Conference (INTERMAG), pp. 885-885, May 8-12, 2006, San Diego, CA.

Tsujisawa et al., "Proposal and Performance Evaluation of a Magneto-Striction Type Torque Sensor Consisting of Small-Sized Coils Connected in Series", ISRN Electronics, vol. 2012, pp. 08, 2012.

U.S. Appl. No. 15/240,772, filed Aug. 18, 2016.

Italian Search Report and Office Action Corresponding to Application No. 201700145097 dated Aug. 6, 2018.

* cited by examiner

SMD-COIL-BASED TORQUE-SENSOR FOR TANGENTIAL FIELD MEASUREMENT

The project leading to this application has received funding from the Clean Sky 2 Joint Undertaking under the European Union's Horizon 2020 research and innovation program under grant agreement No. CS2-FRC_GAM-2014-2015-01.

BACKGROUND

Sensors are used in a variety of industries to sense vibration, torque, speed, force position, temperature and other parameters. In certain applications, the performance of the sensor may decrease due to electrical and/or magnetic interference, temperature fluctuations and stress.

It would be desirable to provide systems and methods to improve the operation of a torque sensor.

BRIEF DESCRIPTION

According to some embodiments, a system includes an installed product including a drive shaft; a magnetostrictive sensor having a sensor probe comprising: a substrate; a drive coil operative to receive a drive current and to emit a magnetic field through the drive shaft, wherein the drive coil is mounted on the substrate; one or more sense coils operative to receive the magnetic field and to transmit a signal based on the received magnetic field, wherein the one or more sense coils are mounted on the substrate; and wherein the magnetic field is emitted from the drive coil in a transverse direction to a radius of the drive shaft.

According to some embodiments, a method includes providing a magnetostrictive sensor including a drive coil and one or more sense coils; receiving a drive current at the drive coil; emitting, from the drive coil, a magnetic field, wherein the magnetic field is emitted in a transverse direction to a radius of a drive shaft of an installed product; and receiving the magnetic field in the drive shaft and at the one or more sense coils.

A technical effect of some embodiments of the invention is an improved and/or computerized technique and system for measuring torque. Embodiments provide for a core-less torque sensor for detecting and measuring torque on a shaft of a machine. In some embodiments, the shaft is a rotating drive train in the machine. As embodiments do not rely on a ferromagnetic core, as compared to conventional sensors, the sensor has improved temperature stability over conventional ferrite-core sensors, and may provide a sensor with a lower manufacturing variability. The improved temperature stability and lower manufacturing variability may provide a more accurate sensor, which may then lead to better engine control. Embodiments provide for the generation, detection and measurement of torque via measurement of a magnetic field transverse to the surface of the shaft.

In one or more embodiments, commercial off-the-shelf (COTS), surface-mount-device (SMD) micro-coils may be applied to generate, and to pick up, magnetic fields for detecting magnetostrictive effects on machine shafts. The utilization of COTS SMD coils may provide a cost-effective way to manufacture the sensor, without compromising the signal strength, as no special parts or special manufacturing processes are needed to make the coil assembly. Additionally, the use of separate coils may allow for the generation and detection of a transverse magnetic field, and may allow for optimization of sensor performance. For example, generating and detecting transverse fields, as opposed to radial fields, may provide benefits with respect to sensor properties and performance (e.g., sensitivity, dynamic range, robustness against interfering factors arising from cable vibrations, temperature expansions, electro-magnetic interference, etc.).

With these and other advantages and features that will become hereinafter apparent, a more complete understanding of the nature of the invention can be obtained by referring to the following detailed description and to the drawings appended hereto.

Other embodiments are associated with systems and/or computer-readable medium storing instructions to perform any of the methods described herein.

DRAWINGS

DETAILED DESCRIPTION

Figure 1:
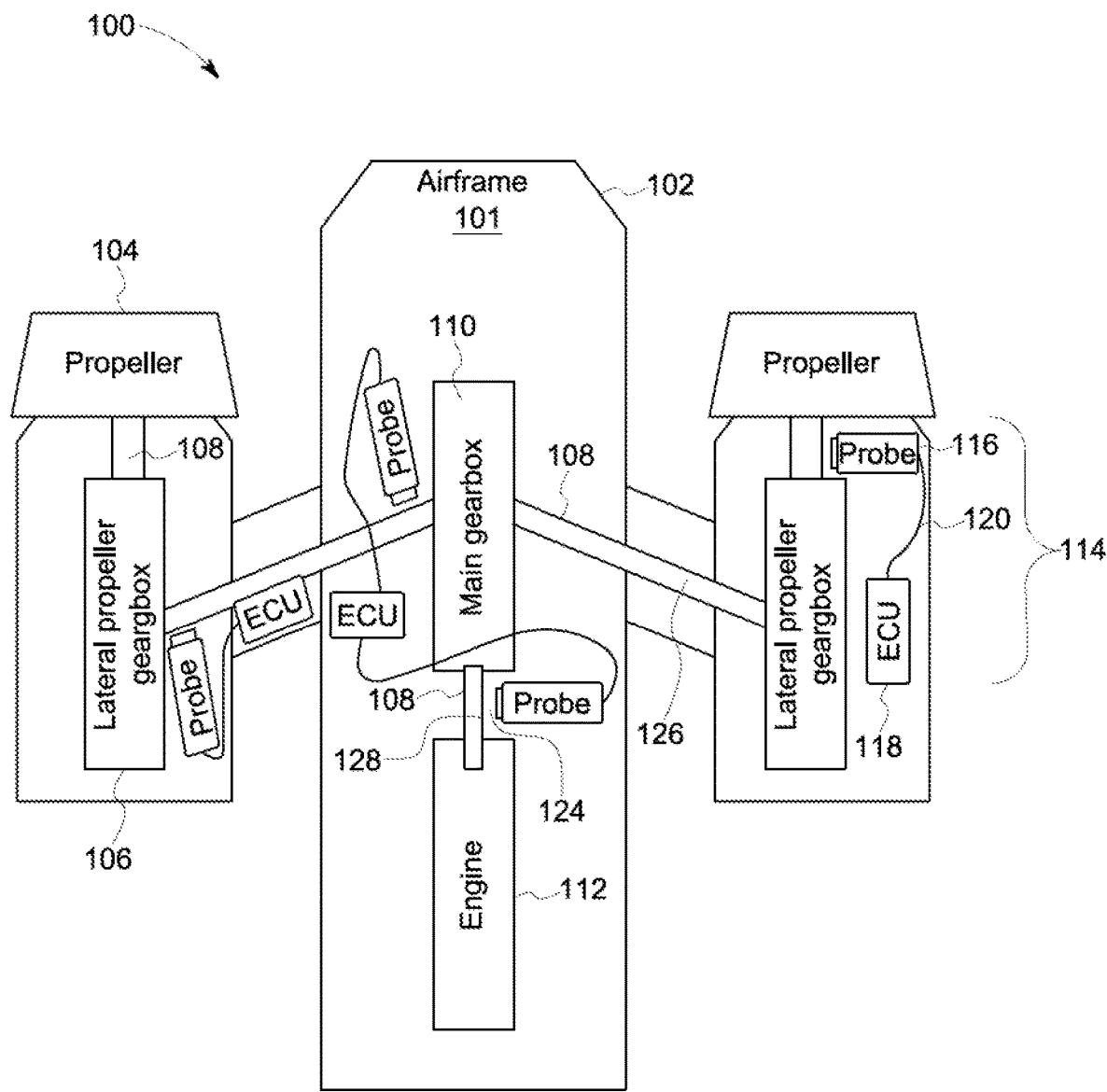
FIG. 1 illustrates a system diagram according to some embodiments.

Magnetostrictive materials may be used for torque sensors, and other sensors, for detecting torque on the shaft of an installed product. For example, the installed product may be a gearbox of a helicopter. More specifically, the helicopter may include a gas turbine, and the gas turbine may transfer rotation to a rotor, which may be used by a shaft in a gearbox. The torque output by rotation of the shaft may be measured with a torque sensor. While the following description may use the non-exhaustive example of a gearbox in a helicopter, any suitable shaft of an installed product be used. Further, while the non-exhaustive examples described herein will be for a rotating drive shaft/train, embodiments may be applied to non-rotating shafts, as well.

Magnetostrictive materials may change their shape or dimensions during the process of magnetization. The torque sensor may detect deformation of the drive shaft (made, in one or more embodiments, from magnetostrictive material) caused by a rotary torque, for example, from a change in magnetic permeability of a magnetostrictive material deformed by the deformation, and may measure the magnitude and direction of the torque. The magnetic capabilities of the shaft may change when torque is applied (e.g., transfer from mechanical property (torque) to magnetic property). The change in magnetic permeability of the magnetostrictive material may be detected from a change in (self-) inductance of a coil (e.g., solenoid coil) or in an inductive cross-coupling between two or more coils, disposed so as not to contact the magnetostrictive material.

In one or more embodiments, torque measurements may be used by other processes to optimize engine performance and safety. For example, if a torque level exceeds a particular threshold for an installed product, an alarm or other suitable indicator may be activated. As another example, torque measurements may be used to create a better installed product design. For example, if one knows the actual mechanical loads (e.g. torque) for an installed product, as opposed to an estimate, safety margins may be reduced. In aviation, for example, reduced safety margins may result in a reduced weight for the aircraft, which may result in fuel savings and other economic advantages.

Conventional torque sensors may use a ferro-magnetic core and have coils mounted on the core. However, ferrite cores may be strongly temperature dependent, which may limit the accuracy of the sensor. For example, if you have an aviation engine flying from the cold temperatures of Alaska to the hot temperatures of Sub-Sahara, differences in temperature may negatively affect the sensitivity of the sensor. Other conventional torque sensors may use a printed circuit-board (PCB) having a coil mounted thereon. However, these PCB sensors may be limited in the number of coil windings that may be stacked on the PCB due to the limited size of the PCB itself. As more windings provide better sensitivity (i.e., detection of changes in the state), and a better signal-to-noise ratio, the limited number of windings on the PCB sensor may compromise the performance of the sensor.

In one or more embodiments, the magnetostrictive torque sensor may include a drive coil to generate a magnetic field that passes through the shaft and returns back to a sense coil (e.g., a pick-up coil) of the sensor. The output of the sense coil is an electrical signal that may depend, at least in part, on the total magnetic reluctance of this loop through the shaft. Part of the total magnetic reluctance is established by an air gap between the coils and the shaft, and part of the total magnetic reluctance is established by the shaft itself with the magnetic reluctance of the shaft changing as a function of torque on the shaft. Changes in the measured magnetic field depend partly on changes in the magnetic permeability of the shaft, which in turn are related to the amount of force applied to the shaft. Therefore, measurement of the magnetic field passing through the shaft may be used to sense and/or calculate the value of the applied force (e.g., torque). In general, non-contact magnetostrictive torque sensors may be used with shafts that have been pre-magnetized (e.g., treated) or non-magnetized shafts.

The term "installed product" should be understood to include any sort of mechanically operational entity, including, but not limited to, computed tomography (CT) scanners, jet engines, locomotives, gas turbines, medical equipment and wind turbines at wind farms and their auxiliary systems as incorporated. The term is most usefully applied to large complex systems with many moving parts, numerous sensors and controls installed in the system. The term "installed" includes integration into physical operations such as the engines in an aircraft fleet whose operations are dynamically controlled, a locomotive in connection with railroad operations, turbines in connection with a windfarm, or apparatus construction in, or as part of, an operating plant building, machines in a factory or supply chain and etc. As used herein, the terms "installed product" and "machine" may be used interchangeably.

As used herein, the term "automatically" may refer to, for example, actions that may be performed with little or no human interaction.

Figure 2:
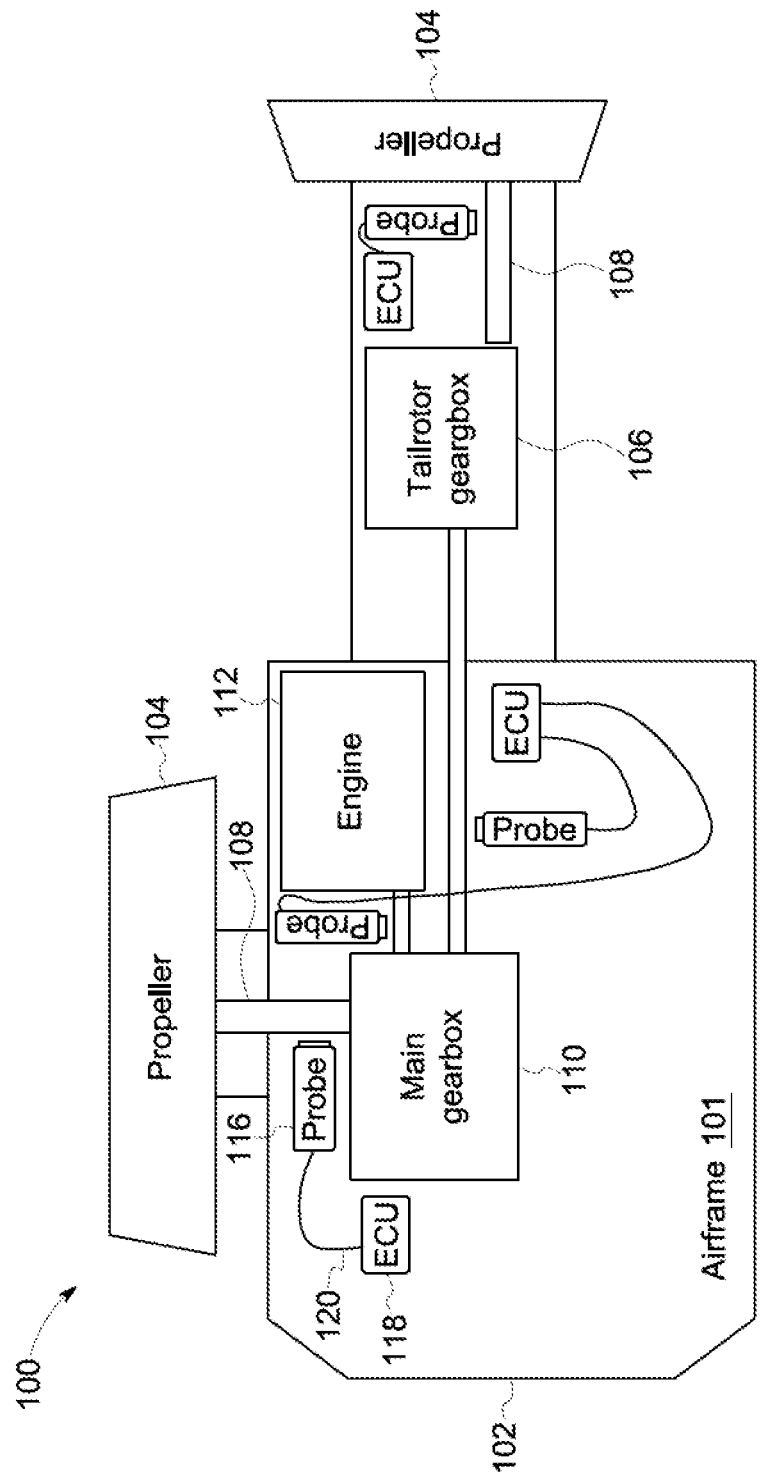
FIG. 2 illustrates a system diagram according to some embodiments.

Turning to FIGS. 1 and 2, a top view and side view, respectively, of a system 100 including an installed product 102 (an aircraft, as shown herein, as a non-exhaustive example) according to embodiments is provided. The installed product 102 may include an airframe 101, and multiple propellers 104. Although two propellers are shown, it should be appreciated that any suitable number of propellers may be included in the aircraft 102. Each propeller 104 may be coupled to a propeller gearbox 106 by a drive shaft 108. In one or more embodiments, each propeller gearbox 106 may be coupled to a main gearbox 110 by a drive shaft 108. In one or more embodiments, the propeller may be coupled to the main gearbox 110 by the drive shaft 108, as shown in FIG. 2. The main gearbox 110 may be coupled to a driver (e.g., engine, such as a reciprocating engine, combustion engine, turbine engine, electric motor, or any other suitable engine) 112 via a drive shaft 108. The driver 112 may apply a force to the drive shaft 108 and enables the drive shaft 108 to rotate and drive a load 104 (e.g., propeller, electrical generator, compressor, pump, etc.) of the installed product 102. The drive shaft 108 may be made from machine steel alloys (e.g., grades 4140 and 4340 (SAE standards), or any other suitable material. It is noted that any steel or metal that is ferromagnetic also may have some magnetostrictive properties. In one or more embodiments, the drive shaft 108 is either untreated (e.g., non-magnetized) or treated (e.g., magnetized).

The drive shaft 108 may be, for example, a rotating shaft, a rotor, any other rotary structure, or any other suitable structure. As described above, the installed product 102 may be a turbomachine (e.g., a turbine engine, a compressor, a pump, a combination thereof), a generator, a combustion engine, a combination thereof, or any other suitable installed product.

In one or more embodiments, the installed product 102 may include one or more sensor systems 114. The sensor system 114 may sense a force applied to the drive shaft 108 of the installed product 102. As used herein, the terms "sensor system" and "magnetostrictive sensor" may be used interchangeably.

Figure 3:
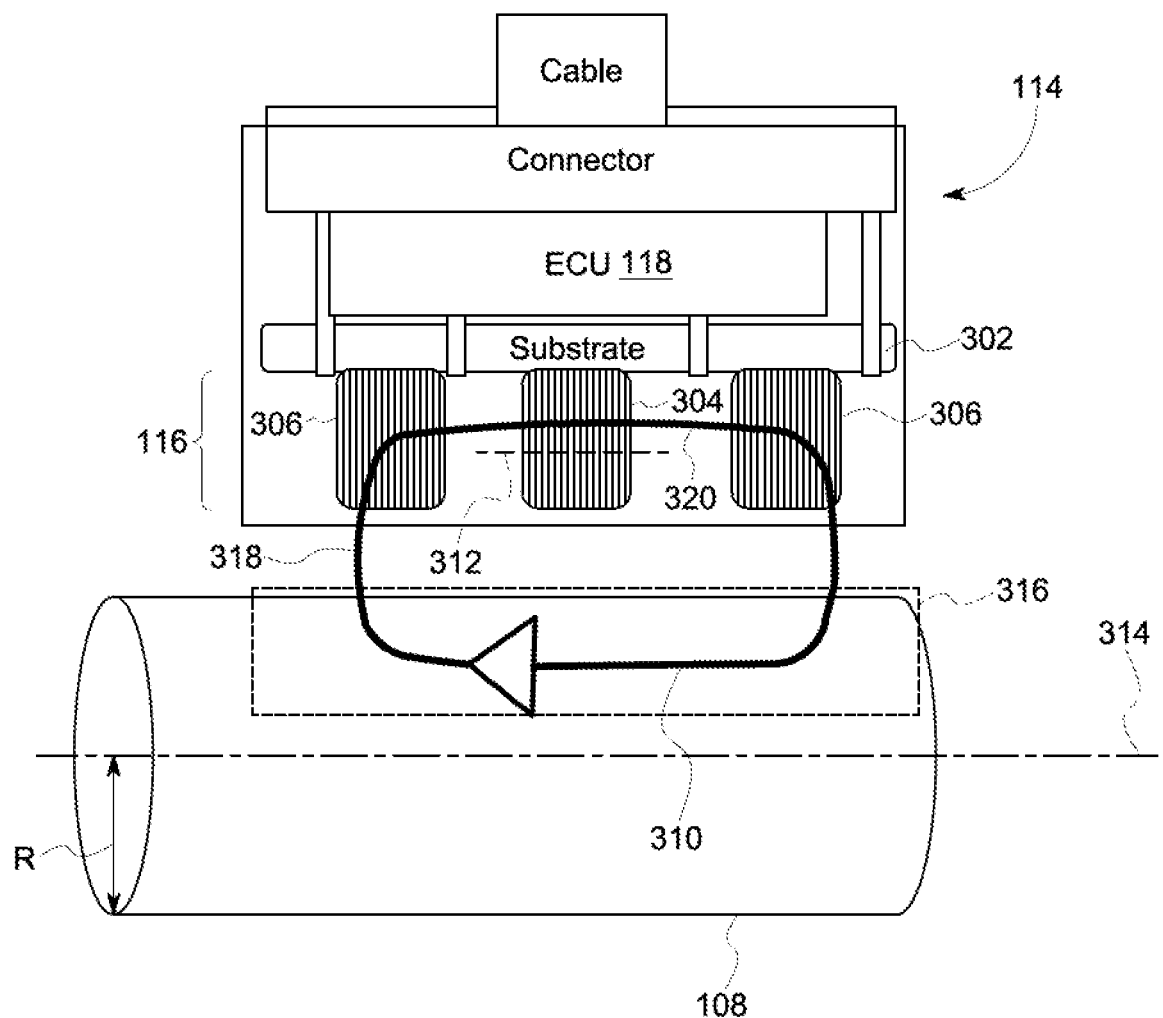
FIG. 3 illustrates a block diagram of a system according to some embodiments.

Each sensor system 114 may include a probe 116, and an electronics control unit (ECU) 118. In embodiments, a cable 120 connects the probe 116 to the ECU 118. In other embodiments, the ECU 118 and probe 116 may be integrated into a single unit, where the cable 120 is not needed. In FIG. 3, where the electronics may be integrated into the probe 116, a cable may be used to interface with an FADEC or other control unit (e.g., the details 51/518 exiting/entering the ECU 118). In one or more embodiments, where the electronics are not integrated into the probe 116 (e.g., it is too hot for the electronics to be so close to the drive train), the cable 120 may connect the ECU 118 to the probe 116 (e.g., FIG. 5). In one or more embodiments, the installed product 102 may include either (with or without the cable) or both embodiments of sensor systems 114.

In one or more embodiments, the probe 116 may form a housing for at least a portion of the sensor system 114. The probe 116 may be positioned proximate to the drive shaft 108, thereby forming a gap 124 between the probe 116 and a shaft surface 126. In one or more embodiments, one or more locations 128 on the drive shaft 108 may be chosen to take torque measurements (e.g., between a propeller 104 and a gearbox 106) For example, the probe 116 may be disposed opposite to, or substantially opposite to, a shaft location 128, and therefore, the sensor system 114 may measure a torque of the drive shaft 108 at the shaft location 128.

In one or more embodiments, the probe 116 may be mounted within the installed product 102 in a manner such that the probe 116 is maintained in a proper orientation and/or position, and to facilitate maintaining the gap 124 constant.

Of note, while three sensor systems 114 are shown in FIG. 1, any suitable number of sensor systems 114 may be used. In embodiments, a single ECU 118 may be coupled to multiple probes 116. In embodiments, a single probe 116 may be coupled to multiple ECUs 118, for redundancy purposes, for example. The system may include both single ECUs 118 coupled to multiple probes 116 and a single probe 116 coupled to multiple ECUs 118.

Figure 4A:
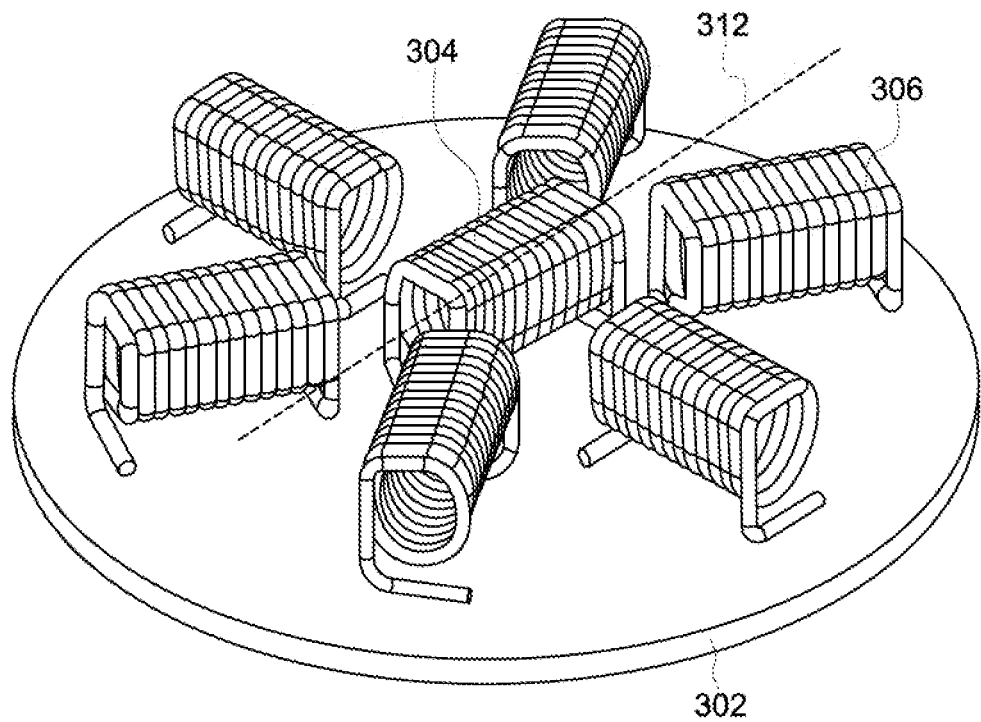
FIGS. 4A and 4B illustrate a system according to some embodiments.
Figure 4B:
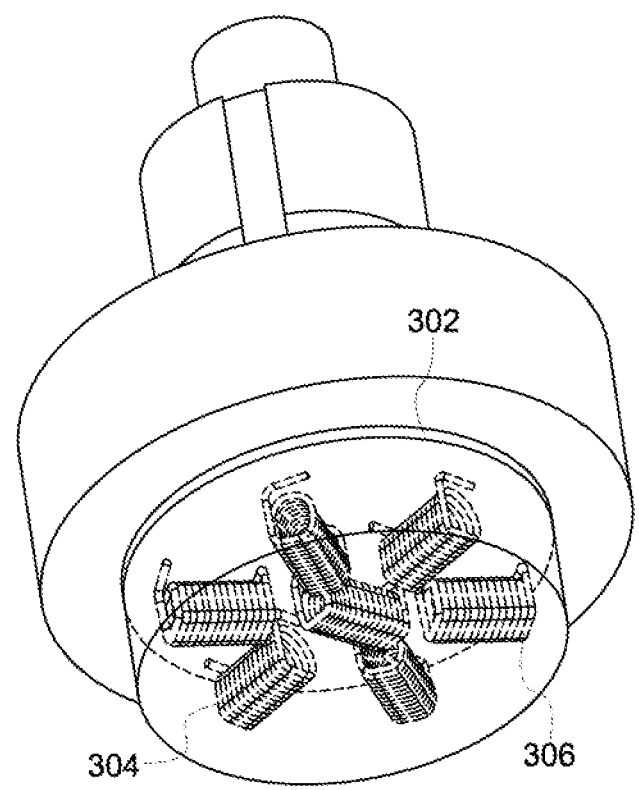

Turning to FIG. 3, a side-view of the sensor system 114 is provided, according to embodiments. The probe 116 may include a substrate 302 housed therein. In one or more embodiments, the substrate 302 may be made from any suitable printed circuit board materials (e.g., FR4, polymide). In one or more embodiments, a drive coil 304 and one or more sense coils 306 may be mounted to the substrate 302. While one drive coil is shown herein, one or more drive coils may be used. As shown in FIGS. 4A and 4B, the drive coil 304 may be mounted centrally on the substrate 302, with the one or more sense coils 306 arranged radially around the drive coil 304. Other suitable orientations for the drive coil 304 and one or more sense coils 306 may be used. As each sense coil 306 detects the magnetic field, when the sense coils are mounted in different orientations, each sense coil 306 may detect the magnetic field 310 a little differently. Of note, as the sense coils 306 are individually mounted to the substrate 302, they may be arranged, in one or more embodiments, to optimize torque measurement and detection, with less noise in the received torque signal from other loads on the drive shaft 108. For example, the placement of the sense coils 306 may compensate for noise provided by different intrinsic properties of the shaft steel or residual/intrinsic stresses (e.g., corrosion, non-optimal machining of the drive train during manufacturing, non-optimal heat treatment, other damage during manufacture or handling of the drive train).

Figure 5:
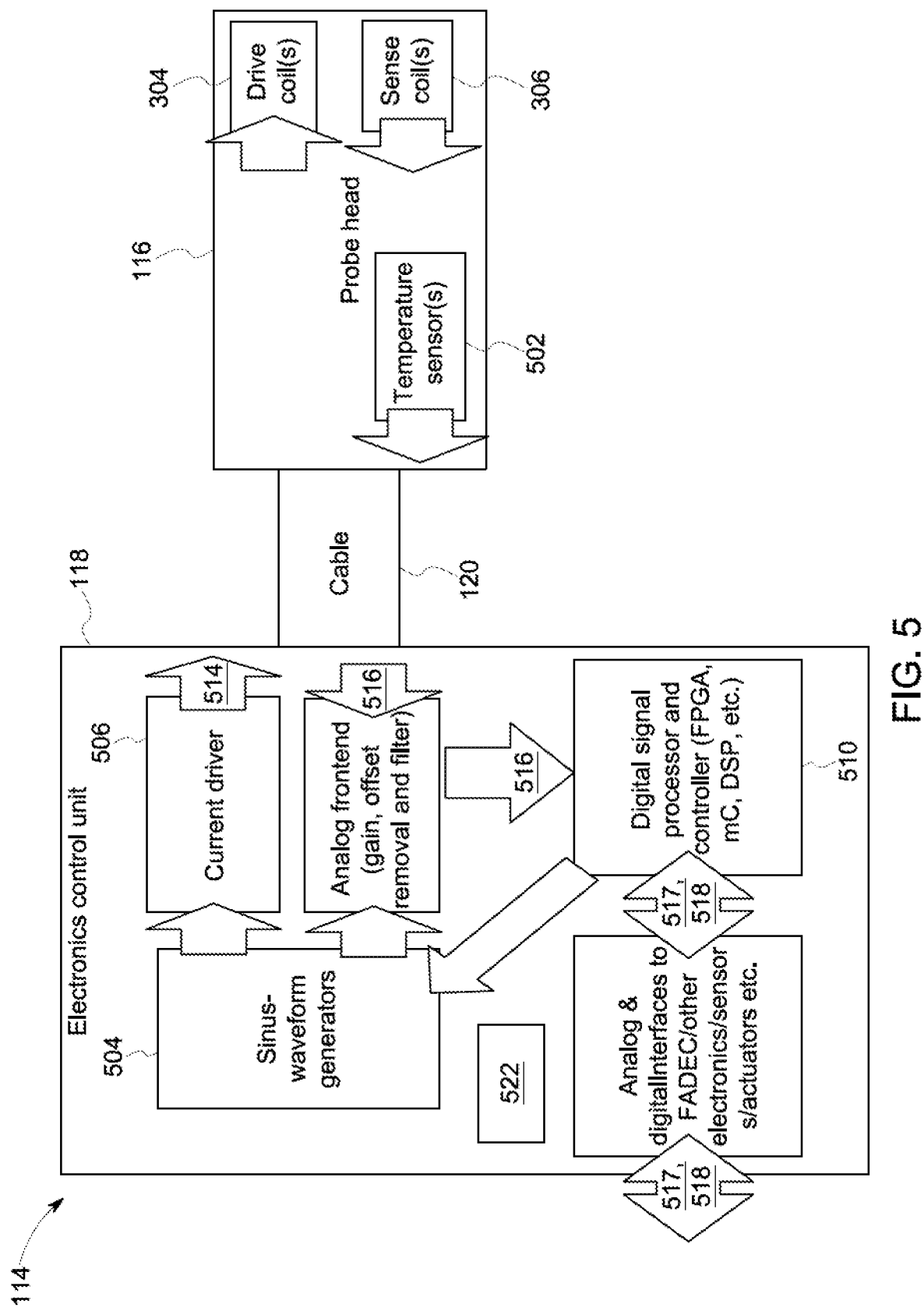
FIG. 5 illustrates a block diagram according to some embodiments

Turning to FIG. 5, a block diagram of the sensor system 114 is provided, according to embodiments. FIG. 5 represents a logical architecture for describing processes according to some embodiments, and actual implementations may include more or different components arranged in other manners.

In one or more embodiments, the probe 116 may also include a temperature sensor 502. The temperature sensor 502 may measure an internal probe temperature to compensate for any temperature effects in the probe performance. The temperature sensor 502 may also provide an indirect indication of a temperature of the drive shaft 108 at the same shaft location 128 where the torque measurement is acquired with sufficient accuracy. The temperature sensor 502 may measure the temperature of the drive shaft 108 during operation of the drive shaft 108 (e.g., in real time) or when the drive shaft 108 is not operating. Temperature variations of the shaft may affect (e.g., change) the shaft's electromagnetic properties (e.g., electrical conductivity and magnetic permeability). The changes in the electromagnetic properties of the shaft may cause variations in the signal received by the sensor system 114. Consequently, the torque measurement derived from the signals received and transmitted by the sense coil(s) 306 may be different than the actual torque on the shaft. In one or more embodiments, it may be desirable to use the temperature measurement to compensate for changes in the magnetic permeability of the drive shaft 108 caused by the temperature variations. In this way, the accuracy of the torque measurements may be increased.

In one or more embodiments, the temperature sensor 502 may be positioned within the probe 116 such that the temperature sensor 502 may not interfere with the magnetic field between the drive coil 304, drive shaft 108 and sense coil(s) 306 (e.g., positioned within a "torque measurement neutral region" of the probe 116). Additionally, or alternatively, the torque measurement neutral region may be any region in which the magnetic field from drive coil(s) may be readily compensated, such as via addition or subtraction of a common magnetic field.

As described above, the sensor system 114 may also include the ECU 118. In one or more embodiments, the ECU 118 may include a sinus-waveform generator 504, a current driver 506, an analog frontend 508, a digital signal processor and controller 510, and analog and digital interfaces 512.

Figure 6:
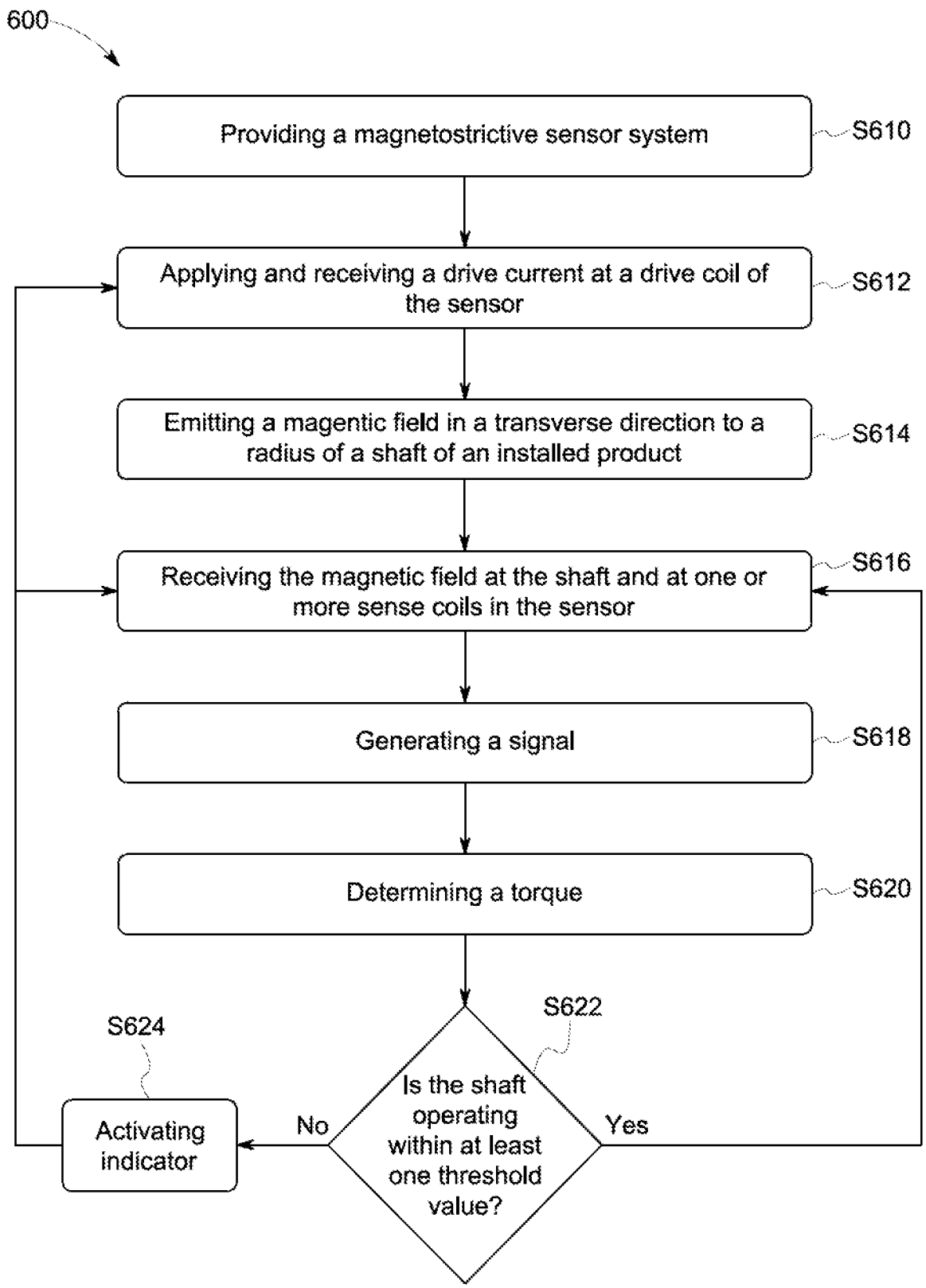
FIG. 6 illustrates a flow diagram according to some embodiments.

Turning to FIG. 6, a flow diagram of an example of operation according to some embodiments is provided. In particular, FIG. 6 provides a flow diagram of a process 600, according to some embodiments. Process 600, and any other process described herein, may be performed using any suitable combination of hardware (e.g., circuit(s)), software or manual means. For example, a computer-readable storage medium may store thereon instructions that when executed by a machine result in performance according to any of the embodiments described herein. In one or more embodiments, the system 100 is conditioned to perform the process 600 such that the system is a special-purpose element configured to perform operations not performable by a general-purpose computer or device. Software embodying these processes may be stored by any non-transitory tangible medium including a fixed disk, a floppy disk, a CD, a DVD, a Flash drive, or a magnetic tape. Examples of these processes will be described below with respect to embodiments of the system, but embodiments are not limited thereto. The flow chart(s) described herein do not imply a fixed order to the steps, and embodiments of the present invention may be practiced in any order that is practicable.

Initially at S610, a sensor system 114 is provided in an installed product 102. Then in S612, a drive current 514 is received at the drive coil 304. In one or more embodiments, a power source (not shown), such as an electrical outlet, electrical generator, batter, etc, may provide power to the ECU 118, and an excitation source 504, such as the sinus-waveform generator, or any other suitable excitation source, may generate a drive current 514 via the current driver 506. In one or more embodiments, the current may be an AC current. The current driver 506 may then transfer the current to the drive coil 304.

Next, in S614, the drive coil 304 emits a magnetic field 310 (FIG. 3). In one or more embodiments, the drive current 514 passes through the drive coil 304 to induce a magnetic field 310 that emanates from the drive coil 304. In one or more embodiments, the digital signal processor and controller 510 may be electronically coupled to the excitation source 504 and may be configured to control characteristics of the drive current 514 delivered to the drive coil 304. For example, the digital signal processor and controller 510 may control the frequency, phase, magnitude, or any other suitable characteristics of the drive current 514. The digital signal processor and controller 510 may be coupled to the excitation source 504 by wired or wireless connections.

In one or more embodiments, the digital signal processor and controller 510 may include a distributed control system (DCS) or any computer-based workstation that is fully or partially automated. For example, the digital signal processor and controller 510 may be any device employing a general purpose or an application specific processor, both of which may generally include memory for storing instructions related to frequencies, amplitudes of currents, etc. In addition, the memory may store instructions for determining torque measurements, determining whether the measurements exceed a threshold value, and to determine actual torque values taking the temperature signals into consideration.

Turning back to the process 600, in S616, the magnetic field 310 is received by the drive shaft 108 and the one or more sense coils 306. In one or more embodiments, the magnetic field 310 permeates a portion of the drive shaft 108, passes through the sense coils 306 and returns to the drive coil 304, thereby forming a loop through the sensor system 114 and the drive shaft 108. In one or more embodiments, the magnetic field 310 may permeate between a few micrometers to a few millimeters of the drive shaft 108 surface, depending, in part on the shaft material and the frequency of the AC signal. In one or more embodiments, the drive coil 304 may be a solenoid, with a central coil axis 312. In one or more embodiments, the probe 116 may be oriented relative to the drive shaft 108 such that the central coil axis 312 may be parallel to a central drive shaft axis 314. In one or more embodiments, this orientation may provide the emission and travel path of the magnetic field 310 as a vector through a portion 316 of the drive shaft 108 in a direction that is transverse to a radius R of the drive shaft 108.

Then, in S618, the sense coil 306 generates a magnetic field signal 516. In one or more embodiments, the sense coil 306 may be used to measure a portion 318 of the magnetic field ("magnetic field portion") that exits the drive shaft 108 and transmit this sensed magnetic field 516 to the digital signal processor and controller 510. Next, in S620, the digital signal processor and controller 510 determines the torque 517 applied to the drive shaft 108. In one or more embodiments, to determine the torque, the digital signal processor and controller 510 may first determine the change in the magnetic field (e.g., amplitude increase or decrease). A force (e.g., compressive, tensile, torsional, etc.) applied to the drive shaft 108 may change the magnetic permeability of the drive shaft 108, thereby causing the magnetic field portion 318 to change. In particular, in one or more embodiments, a change in force may cause the drive train to get strained (e.g., according to Hooke's law). The change in strain may cause a change in the magnetic permeability of the drive shaft, which may change the magnetic field, and in turn may result in a change in the induced voltage in the sense coil. As such, the torque applied to the drive shaft 108 may be determined, by the digital signal processor and controller 510, based on the change in magnetic field portion 318 received by the sense coil 306 relative to a portion of the magnetic field emitted 320 ("emitted magnetic field portion") by the drive coil 304. In one or more embodiments, the digital signal processor and controller 510 may execute pre-stored and/or user-defined processes in the memory to calculate the magnitude of the force applied to the drive shaft 108 based on the characteristics of the drive shaft 108, the probe 116 and the driving current.

The magnetic field signal 516 emitted by the sense coil 306 may be communicated by wired or wireless connections to the digital signal processor and controller 510. In some embodiments, wireless communication devices (e.g., RF transmitters) may be integrated with the probe 116 (e.g., proximate the sense coil 306) to transmit the signals to a receiver (e.g., Analog front end 508) coupled to and/or integrated with, the digital signal processor and controller 510. The receiver 508 may include electronic components (e.g., an amplifier, filter, gain, offset removal or the like) that condition the magnetic field signal 516 before transmitting the magnetic field signal 516 to the digital signal processor and controller 510. In other embodiments, the torque signal 517 may be conditioned after being processed by the digital signal processor and controller 510.

Turning back to the process 600, then in S622 it is determined whether the torque 517 applied to the drive shaft 108 is below a pre-defined threshold value or within a pre-defined range of values. If, it is determined in S622 that the torque 517 is within the pre-defined threshold, the process may return to S612, and sensor system 114 continues to monitor the installed product 102. If it is determined in S622 that the torque is not within the pre-defined threshold, the process may proceed to S624, and an indicator 518 may be activated. For example, in one or more embodiments, the indicator 518 may at least one of: alert an operator of the threshold violation, and cause manipulation of the operation of the installed product 102. In one or more embodiments, activation of the indicator in S624, may cause a change in the operation of the rotor aspect of the installed product (either via pilot or via FADEC or other electronic controller, for example). In one or more embodiments, after the indicator is activated, the process 600 may return to S612, and sensor system 114 may continue to monitor the installed product 102. In one or more embodiments, after the indicator is activated, the process 600 may in addition to, or instead of, return to S616, as the system 100 may continue to monitor the torque the same way, regardless if an over-torque is reached or not, In one or more embodiments, the determined torque 517 maybe used by the signal processor and controller 510 in other applications, like performance estimation, or balancing of torque between multiple drive train parts (e.g., if there are more than one propeller connected to the drive train).

In one or more embodiments, after the torque is determined by the digital signal processor and controller 510, the torque signal may be transmitted to the analog and digital interfaces 512, which may in turn transmit the torque signal to at least one of a full authority digital engine/electronic control (FADEC), electronic(s), sensor(s) actuator(s), user platform or any other suitable element.

In one or more embodiments, the force and/or torque signal may be transmitted to (and in some instances presented on) at least one of various user platforms (e.g., a control system, a desktop computer, a laptop computer, a personal digital assistant, a tablet, a smartphone, etc.) or to other systems/elements, as appropriate (e.g., for display to, and manipulation by, a user). According to one or more embodiments, the system 100 may execute program code of a software application for presenting interactive graphical user display interfaces to allow interaction with the system 100. In one or more embodiments, the torque signal may be used to operate the installed product 102, operate another system, or be input to another system. In one or more embodiments, the output force and/or torque signal may directly operate the installed product 102 or other system without further human interaction.

In one or more embodiments, operation of the installed product 102 may be manipulated based on the receipt of the force and/or torque signal by at least one of a full authority digital engine/electronic control (FADEC), electronic(s), sensor(s) actuator(s), or any other suitable element In one or more embodiments, the sensor 114 may include a data store 522, which may comprise any combination of one or more of a hard disk drive, RAM (random access memory), ROM (read only memory), flash memory, etc. The data store 522 may store software that programs the sensor 114 uses to perform functionality as described herein.

The data store 522 may support multi-tenancy to separately support multiple unrelated clients by providing multiple logical database systems which are programmatically isolated from one another.

The data from the data store 522 may be included in a relational database, a multi-dimensional database, an eXtendable Markup Language (XML) document, and/or any other structured data storage system. The physical tables of data store 522 be distributed among several relational databases, multi-dimensional databases, and/or other data sources. The data of data store 522 may be indexed and/or selectively replicated in an index.

The data store 522, may implement an "in-memory" database, in which volatile (e.g., non-disk-based) storage (e.g., Random Access Memory) is used both for cache memory and for storing data during operation, and persistent storage (e.g., one or more fixed disks) is used for offline persistency of data and for maintenance of database snapshots. Alternatively, volatile storage may be used as cache memory for storing recently-used database data, while persistent storage stores data. In some embodiments, the data comprises one or more of conventional tabular data, row-based data stored in row format, column-based data stored in columnar format, and object-based data.

As used herein, devices, including those associated with the system 100 and any other devices described herein, may exchange information and transfer data ("communication") via any number of different systems, including one or more wide area networks (WANs) and/or local area networks (LANs) that enable devices in the system to communicate with each other. In some embodiments, communication may be via the Internet, including a global internetwork formed by logical and physical connections between multiple WANs and/or LANs. Alternately, or additionally, communication may be via one or more telephone networks, cellular networks, a fiber-optic network, a satellite network, an infrared network, a radio frequency network, any other type of network that may be used to transmit information between devices, and/or one or more wired and/or wireless networks such as, but not limited to Bluetooth access points, wireless access points, IP-based networks, or the like. Communication may also be via servers that enable one type of network to interface with another type of network. Moreover, communication between any of the depicted devices may proceed over any one or more currently or hereafter-known transmission protocols, such as Asynchronous Transfer Mode (ATM), Internet Protocol (IP), Hypertext Transfer Protocol (HTTP) and Wireless Application Protocol (WAP).

Figure 7:
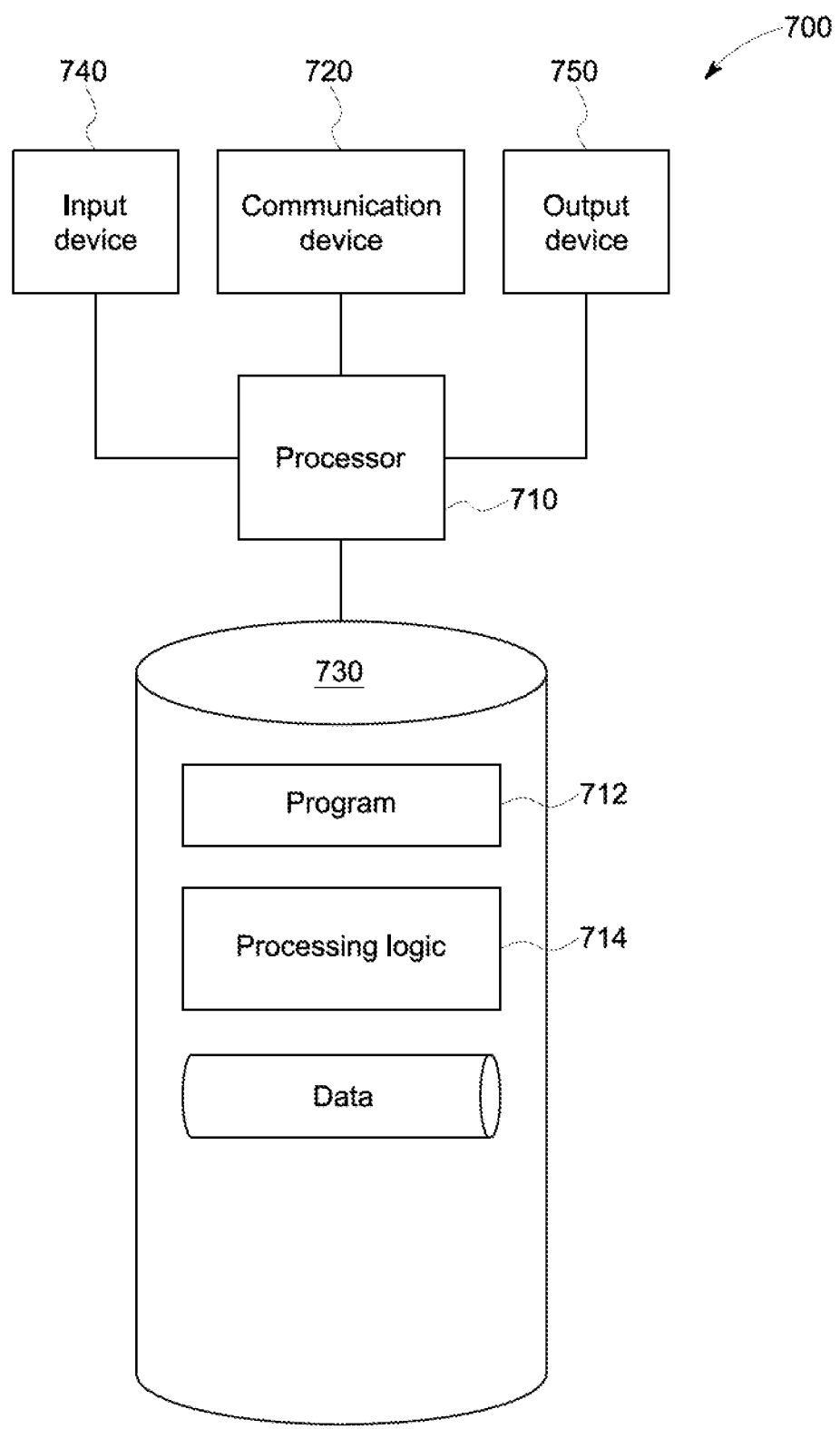
FIG. 7 illustrates a system diagram to some embodiments.

Note the embodiments described herein may be implemented using any number of different hardware configurations. For example, FIG. 7 illustrates a torque platform 700 that may be, for example, associated with the systems described herein (e.g., system 100 of FIG. 1). The torque platform 700 comprises a torque processor 710 ("processor"), such as one or more commercially available Central Processing Units (CPUs) in the form of one-chip microprocessors, coupled to a communication device 720 configured to communicate via a communication network (not shown in FIG. 7). The communication device 720 may be used to communicate, for example, with one or more users. The torque platform 700 further includes an input device 740 (e.g., a mouse and/or keyboard to enter information) and an output device 750 (e.g., to output and display the manipulations).

The processor 710 also communicates with a memory/storage device 730. The storage device 730 may comprise any appropriate information storage device, including combinations of magnetic storage devices (e.g., a hard disk drive), optical storage devices, mobile telephones, and/or semiconductor memory devices. The storage device 730 may store a program 712 and/or torque processing logic 714 for controlling the processor 710. The processor 710 performs instructions of the programs 712, 714, and thereby operates in accordance with any of the embodiments described herein. For example, the processor 710 may receive data and then may apply the instructions of the programs 712, 714 to determine the torque on a drive shaft.

The programs 712, 714 may be stored in a compressed, uncompiled and/or encrypted format. The programs 712, 714 may furthermore include other program elements, such as an operating system, a database management system, and/or device drivers used by the processor 710 to interface with peripheral devices.

As used herein, information may be "received" by or "transmitted" to, for example: (i) the platform 700 from another device; or (ii) a software application or module within the platform 700 from another software application, module, or any other source.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein. The method steps can then be carried out using the distinct software modules and/or sub-modules of the system, as described above, executing on one or more hardware processors 710 (FIG. 7). Further, a computer program product can include a computer-readable storage medium with code adapted to be implemented to carry out one or more method steps described herein, including the provision of the system with the distinct software modules.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspects, can be mixed and matched by one of ordinary skill in the art to construct additional embodiments and techniques in accordance with principles of this application.

Those in the art will appreciate that various adaptations and modifications of the above-described embodiments can be configured without departing from the scope and spirit of the claims. Therefore, it is to be understood that the claims may be practiced other than as specifically described herein.

The invention claimed is:

1. A system comprising:
    an installed product including a drive shaft;
    a magnetostrictive sensor having a sensor probe comprising:
        a substrate that is positioned on one side of the derive shaft;
        a drive coil operative to receive a drive current and to emit a magnetic field through the drive shaft, wherein the drive coil is mounted on the substrate;
        one or more sense coils operative to receive the magnetic field and to transmit a signal based on the received magnetic field, wherein the one or more sense coils are mounted on the substrate; and
        wherein the magnetic field is emitted from the drive coil in a transverse direction to a radius of the drive shaft.

2. The system of claim 1, wherein the magnetic field is received in a portion of the drive shaft as a vector that is transverse to the radius of the drive shaft.

3. The system of claim 1, wherein a central axis of the drive coil is positioned parallel to the drive shaft.

4. The system of claim 1, wherein the drive coil is positioned centrally on the substrate and the one or more sense coils are mounted on the substrate radially from the drive coil.

5. The system of claim 1, wherein the magnetic field received by the one or more sense coils is different from the magnetic field emitted by the drive coil, based at least in part on a force on the drive shaft.

6. The system of claim 1, wherein the drive shaft is a rotating drive shaft.

7. The system of claim 1, wherein the substrate is a planner substrate.

8. The system of claim 1, wherein the signal is based on a torque of the drive shaft.

9. The system of claim 1, further comprising:
    a controller including a processor and a memory in communication with the processor, the memory storing program instructions, wherein the processor is operative with the program instructions to perform functions as follows:
        receiving the signal from the one or more sense coils; and
        determining, based on the received signal, whether the drive shaft is operating within one or more thresholds.

10. The system of claim 1, wherein the installed product is one of an aircraft, a locomotive, a turbine, or engine.

11. A method comprising:
    providing a magnetostrictive sensor including a drive coil and one or more sense coils, the drive coil being mounted on a substrate and the one or more sense coils being mounted on the substrate wherein the substrate is positioned on one side of the derive shaft;
    receiving a drive current at the drive coil;
    emitting, from the drive coil, a magnetic field, wherein the magnetic field is emitted in a transverse direction to a radius of a drive shaft of an installed product; and
    receiving the magnetic field in the drive shaft and at the one or more sense coils.

12. The method of claim 11, wherein the magnetic field is received in a portion of the drive shaft as a vector that is transverse to the radius of the drive shaft.

13. The method of claim 11, further comprising:
    positioning a central axis of the drive coil parallel to the drive shaft.

14. The method of claim 11 wherein the drive coil is positioned centrally on the substrate of the magnetostrictive sensor and the one or more sense coils are mounted on the substrate radially from the drive coil.

15. The method of claim 11, wherein the magnetic field received by the one or more sense coils is different from the magnetic field emitted by the drive coil, based at least in part on a force on the drive shaft.

16. The method of claim 11, wherein the drive shaft is a rotating drive shaft.

17. The method of claim 11, wherein the magentostrictive sensor is a torque sensor.

18. The method of claim 11, wherein the signal is based on a torque of the drive shaft.

19. The method of claim 11, further comprising:
    receiving the signal from the one or more sense coils at a controller; and
    determining, at the controller, whether the drive shaft is operating within a threshold, based on the received signal.

20. A system comprising:
    an installed product including a drive shaft;
    a magnetostrictive sensor having a sensor probe comprising:
        a substrate;
        a drive coil operative to receive a drive current and to emit a magnetic field through the drive shaft, wherein the drive coil is mounted on the substrate;
        one or more sense coils operative to receive the magnetic field and to transmit a signal based on the received magnetic field, wherein the one or more sense coils are mounted on the substrate; and
        wherein the magnetic field is emitted from the drive coil in a transverse direction to a radius of the drive shaft, and
        wherein the drive coil is positioned centrally on the substrate and the one or more sense coils are mounted on the substrate radially from the drive coil.

* * * * *